(12) United States Patent
Soltani et al.

(10) Patent No.: US 12,074,359 B2
(45) Date of Patent: Aug. 27, 2024

(54) MICROWAVE RESONATOR DEVICE INCLUDING AT LEAST ONE DIELECTRIC RESONATOR MEMBER CONFIGURED TO PROVIDE FOR RESONANT FIELD ENHANCEMENT

(71) Applicant: Raytheon BBN Technologies, Corp., Cambridge, MA (US)

(72) Inventors: Moe D. Soltani, Belmont, MA (US); Ian Moore, Andover, MA (US); Ken Dinndorf, Belford, NH (US)

(73) Assignee: RAYTHEON BBN TECHNOLOGIES CORP., Cambridge, MA (US)

( * ) Notice: Subject to any disclaimer, the term of this patent is extended or adjusted under 35 U.S.C. 154(b) by 0 days.

(21) Appl. No.: 17/743,400

(22) Filed: May 12, 2022

(65) Prior Publication Data
US 2023/0369736 A1   Nov. 16, 2023

(51) Int. Cl.
*H01P 7/10*   (2006.01)
*G01R 29/08*   (2006.01)
*H01P 1/208*   (2006.01)
*H01P 11/00*   (2006.01)

(52) U.S. Cl.
CPC ............ *H01P 7/10* (2013.01); *G01R 29/08* (2013.01); *H01P 1/2084* (2013.01); *H01P 11/007* (2013.01); *H01P 11/008* (2013.01)

(58) Field of Classification Search
CPC ......... H01P 1/2084; H01P 7/10; H01P 11/007
USPC ........................................................ 333/202
See application file for complete search history.

(56) References Cited

U.S. PATENT DOCUMENTS

| 5,909,160 A | 6/1999 | Dick et al. | |
| 6,563,401 B1* | 5/2003 | Abbas et al. | H01P 1/2084 |
| | | | 333/219.1 |
| 2002/0180559 A1* | 12/2002 | Jang | H01P 1/2084 |
| | | | 333/219.1 |
| 2021/0255258 A1 | 8/2021 | Barry et al. | |

OTHER PUBLICATIONS

Eisenach et al., Cavity-enhanced microwave readout of a solid-state spin sensor, Nature Communications, Mar. 1, 2021, 7 pages.
(Continued)

*Primary Examiner* — Benny T Lee
(74) *Attorney, Agent, or Firm* — CANTOR COLBURN LLP

(57) ABSTRACT

A microwave resonator device including a first resonator member comprised of a dielectric material and a second resonator member comprised of a dielectric material. The second resonator member can be positioned spatially offset from the first resonator member to define a spatial interaction region configured to confine an electromagnetic field in a microwave region of the electromagnetic spectrum. The spatial offset between the first resonator member and the second resonator member defining the spatial interaction region is less than the microwave wavelength associated with a resonant frequency of the microwave resonator device. The microwave resonator device facilitates generation of a resonant field enhancement within the spatial interaction region.

34 Claims, 11 Drawing Sheets

(56) References Cited

OTHER PUBLICATIONS

Sherman et al., Performance analysis of diamond-based masers, Journal of Applied Physics, Apr. 14, 2021, 14 pages, American Institute of Physics, College Park, Maryland.
Trusheim et al., A Polariton-Stabilized Spin Clock, https://arxiv.org/abs/2009.02427, Sep. 22, 2020, 6 pages.
Vallabhapurapu et al., Fast coherent control of an NV- spin ensemble using a $KTaO_3$ dielectric resonator at cryogenic temperatures, https://arxiv.org/abs/2105.06781, Aug. 29, 2021, 19 pages.
Extended European Search Report issued Oct. 2, 2023, in EP Application No. 23173231.4 filed May 12, 2023, 16 pages.

* cited by examiner

1000

1002 configuring a first resonator member to be comprised of a dielectric material.

↓

1004 configuring a second resonator member comprised of a dielectric material to be spatially offset from the first resonator member to define a spatial interaction region between the first resonator member and the second resonator member configured to confine an electromagnetic field in a microwave region of the electromagnetic spectrum.

↓

1006 configuring the microwave resonator to have a resonance enhancement factor of $10^3$ or greater, the resonance enhancement factor determining the resonant field enhancement.

1102 configuring a resonator member that is configured to confine an electromagnetic field in a microwave region of the electromagnetic spectrum to comprise a thickness measured in a direction parallel to a longitudinal axis of the resonator member.

↓

1104 configuring the thickness of the resonator member to be smaller than a microwave wavelength associated with a resonant frequency of the microwave resonator device.

↓

1106 configuring the microwave resonator to have a resonance enhancement factor of $10^3$ or greater, the resonance enhancement factor determining the resonant field enhancement.

FIG. 11

MICROWAVE RESONATOR DEVICE INCLUDING AT LEAST ONE DIELECTRIC RESONATOR MEMBER CONFIGURED TO PROVIDE FOR RESONANT FIELD ENHANCEMENT

BACKGROUND

Microwave resonators are often utilized in applications involving field sensing, time keeping, oscillators, and many others. Current microwave resonators are of a sufficiently large size that they are not useful for many applications in which field sensing, time keeping, and other applications are desired to be utilized. For example, some current resonators have a large mode volume of 10 cc-100 cc and larger. Additionally, some current resonators suffer from losses that limit the quality and efficiency of the resonators. As such, there is a desire in the industry to fabricate smaller, more compact microwave resonators with higher quality factors to increase the possible uses as well as reliability and efficiency for microwave resonators.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein:

FIG. 10 illustrates a method of configuring a microwave resonator in accordance with an example of the present disclosure.

FIG. 11 illustrates a method of configuring a microwave resonator in accordance with an example of the present disclosure.

Figure 1A:
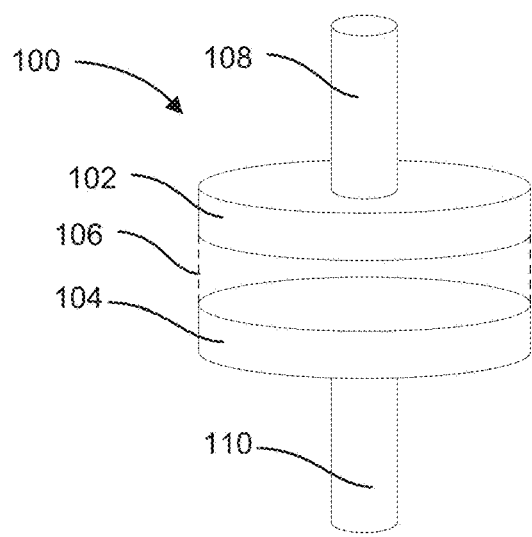
FIG. 1A illustrates a front elevation view a microwave resonator in accordance with an example of the present disclosure.

Reference will now be made to the exemplary embodiments illustrated, and specific language will be used herein to describe the same. It will nevertheless be understood that no limitation of the scope of the invention is thereby intended.

DETAILED DESCRIPTION OF THE INVENTION

In describing and claiming the present disclosure, the following terminology will be used in accordance with the definitions set forth below.

The singular forms "a," "an," and, "the" include express support for plural referents unless the context clearly dictates otherwise. Thus, for example, reference to "a pin" includes reference to one or more of such pins, and reference to "the arm" includes reference to one or more of such arms.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The term "coupled," as used herein, is defined as directly or indirectly connected in a chemical, mechanical, electrical, fluidic, non-mechanical, non-chemical, nonelectrical, or non-fluidic manner. Objects described herein as being "adjacent to" each other may be in physical contact with each other, in close proximity to each other, or in the same general region or area as each other, as appropriate for the context in which the phrase is used. "Directly coupled" objects, structures, elements, or features are in contact with one another and may be attached. Further as used in this written description, it is to be understood that when using the term "coupled" support is also afforded for "directly coupled" and vice versa.

As used herein, comparative terms such as "increased," "decreased," "better," "worse," "higher," "lower,"

"enhanced," "maximized," "minimized," and the like refer to a property of a device, system, step, component, composition, or activity that is measurably different from other devices, components, compositions or activities that are in a surrounding or adjacent area, that are similarly situated, that are in a single device or composition or in multiple comparable devices or compositions, that are in a group or class, that are in multiple groups or classes, or as compared to the known state of the art.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or subranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if the composition completely lacked particles. In other words, a composition that is "substantially free of" an ingredient or element may still actually contain such item as long as there is no measurable effect thereof.

Before exemplary embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of devices, methods, systems, elements thereof, etc., to provide a thorough understanding of various exemplary embodiments. One skilled in the relevant art will recognize, however, that such detailed embodiments do not limit the overall inventive concepts articulated herein, but are merely representative thereof.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

An initial overview of the inventive concepts is provided below and then specific examples are described in further detail later. This initial summary is intended to aid readers in understanding the examples more quickly, but is not intended to identify key features or essential features of the examples, nor is it intended to limit the scope of the claimed subject matter.

Described herein is a microwave resonator device. The microwave resonator device can include a first resonator member comprised of a dielectric material. The microwave resonator can further include a second resonator member comprised of a dielectric material, the second resonator member being positioned spatially offset from the first resonator member to define a spatial interaction region between the first resonator member and the second resonator member configured to confine an electromagnetic field in a microwave region of the electromagnetic spectrum. The spatial offset between the first resonator member and the second resonator member defining the spatial interaction region is less than a microwave wavelength associated with a resonant frequency of the microwave resonator device. The microwave resonator device facilitates generation of a resonant field enhancement within the spatial interaction region.

Described herein is a microwave resonator device. The microwave resonator device can include a resonator member comprised of a dielectric material and configured to confine an electromagnetic field in a microwave region of the electromagnetic spectrum. The thickness of the resonator member can be smaller than a microwave wavelength associated with a resonant frequency of the microwave resonator device. The microwave resonator device can facilitate generation of a resonant field enhancement within around in proximity to the resonator member.

Described herein is a method of facilitating formation of a microwave resonator device. The method can comprise configuring a first resonator member to be comprised of a dielectric material. The method can further comprise configuring a second resonator member comprised of a dielectric material to be spatially offset from the first resonator member to define a spatial interaction region between the first resonator member and the second resonator member configured to confine an electromagnetic field in a microwave region of the electromagnetic spectrum. A thickness of the first resonator member and a thickness of the second resonator member are smaller than a microwave wavelength associated with a resonant frequency of the microwave resonator device. The spatial offset between the first resonator member and the second resonator member defining the spatial interaction region can be less than the microwave wavelength associated with the resonant frequency. The microwave resonator device can facilitate generation of a resonant field enhancement within the spatial interaction region.

Disclosed herein is a method of facilitating formation of a microwave resonator device. The method can comprise configuring a resonator member that is configured to confine an electromagnetic field in a microwave region of the electromagnetic spectrum to comprise a thickness measured in a direction parallel to a longitudinal axis of the resonator member. The method can further comprise configuring the resonator member to be composed of a dielectric material. The method can further include configuring the thickness of the resonator member to be smaller than a microwave wavelength associated with a resonant frequency of the microwave resonator device.

To further describe the present technology, examples are now provided with reference to the figures. With reference to FIG. 1A, a microwave resonator 100 in accordance with an example of the present disclosure is illustrated. The microwave resonator 100 shown can be a resonator configured to confine waves (e.g., an electromagnetic field) in the microwave range of the electromagnetic spectrum. The microwave resonator 100 can be a dual member resonator including a first resonator member 102 and a second resonator member 104. The first and second resonator members 102 and 104, as illustrated, can be disk shaped. However, the shape of the resonator members is not intended to be limited in any way by this disclosure. The resonator members can have a disk shape, a ring shape, or any other shape. For example, shapes with corners can also be used to get enhanced edge effects for in/out coupling or sensing. In short, any workable shape for a microwave resonator can be used.

The first resonator member 102 and the second resonator member 104 can be positioned parallel to each other. The first resonator member 102 and the second resonator member 104 can further be axially aligned with each other such that centers and axes of each of the first resonator member 102 and the second resonator member 104 are in substantial alignment with each other. The first resonator member 102 and the second resonator member 104 can be positioned apart from each other to be spatially offset from each other. The spatial offset between the first resonator member 102 and the second resonator member 104 can define a spatial interaction region 106 between the first resonator member 102 and the second resonator member 104.

The spatial interaction region 106 can be configured to confine an electromagnetic field provided to the microwave resonator by a microwave emitter or by an outside environment. The electromagnetic field can be a field in a microwave region of the electromagnetic spectrum. The electromagnetic field confined in the spatial interaction region 106 of the microwave resonator 100 can comprise microwaves having a wavelength and frequency substantially the same as a resonant frequency/wavelength of the microwave resonator 100, to which the microwave resonator 100 is tuned.

The spatial interaction region can be configured to contain a vacuum between the first resonator member and the second resonator member, a gas material of lower dielectric constant than a dielectric constant in the first resonator member and the second resonator member, a solid material of lower dielectric constant than a dielectric constant in the first resonator member and the second resonator member, or a liquid material of lower dielectric constant than a dielectric constant in the first resonator member and the second resonator member.

As further illustrated in FIG. 1A, a first mount 108 can be coupled to the first resonator member 102. A second mount 110 can be couple to the second resonator member 104. The mounts 108 and 110 can be made of a same or different materials then the first resonator member 102 and the second resonator member 104. The mounts 108 and 110 can be mounted to the resonator members 102 and 104 using any known method for coupling a mount to a resonator member, such as adhesive, welding, mechanical coupling, or any other known method that does not adversely affect the function of the resonator to an undesirable amount. The method of mounting the mounts to the resonator members is not intended to be limited by this disclosure in any way.

The first mount 108 and the second mount 110 can facilitate mounting the microwave resonator 100 to an enclosure. Specifically, the first mount 108 can facilitate mounting the first resonator member 102 to an inner surface of an enclosure and the second mount can facilitate mounting the second resonator member 104 to an inner surface of an enclosure. The mounts 108 and 110 can be sized to ensure that the resonator members are disposed apart at the spatial offset to define the spatial interaction region 106.

Figure 1B:
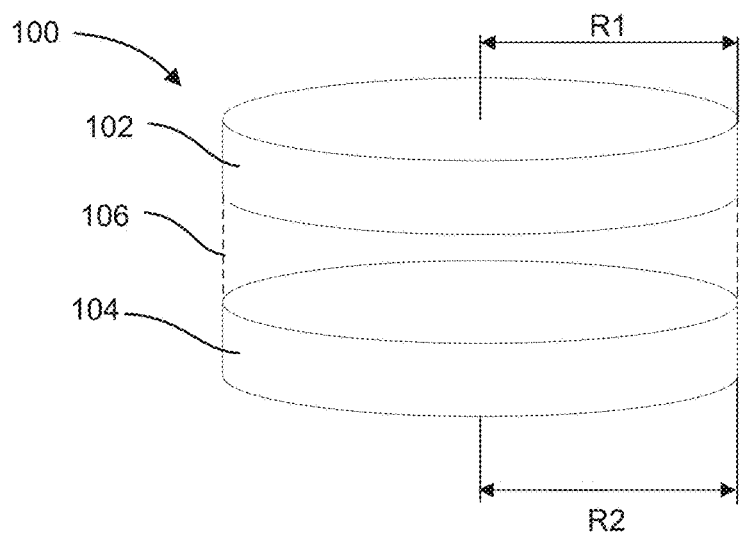
FIG. 1B illustrates a close up front elevation view of the microwave resonator of FIG. 1A.

As shown in FIG. 1B, the first resonator member 102 can be a disk having a size at least partially defined by a radius R1. Similarly, the second resonator member 104 can be a disk having a size at least partially defined by a radius R2. As shown in FIG. 1O, the first resonator member 102 can be a disk having a thickness T1. The second resonator member 104 can be a disk having a thickness T2.

The first resonator member 102 and the second resonator member 104 can be spaced apart by a spatial offset D1, which is a distance between the first resonator member 102 and the second resonator member 104 as shown in FIG. 1O. The spatial interaction region 106 disposed between the first resonator member 102 and the second resonator member 104 can be defined by one or more of the spatial offset D1 and the radii R1 and R2 of the first resonator member 102 and the second resonator member 104. For example, the spatial interaction region 106 can be an area bounded between the resonator members 102 and 104 and can have a size corresponding to the size of the spatial offset D1. The spatial interaction region 106 can further be defined by the surface sizes of the first resonator member 102 and the second resonator member 104.

Figure 1C:
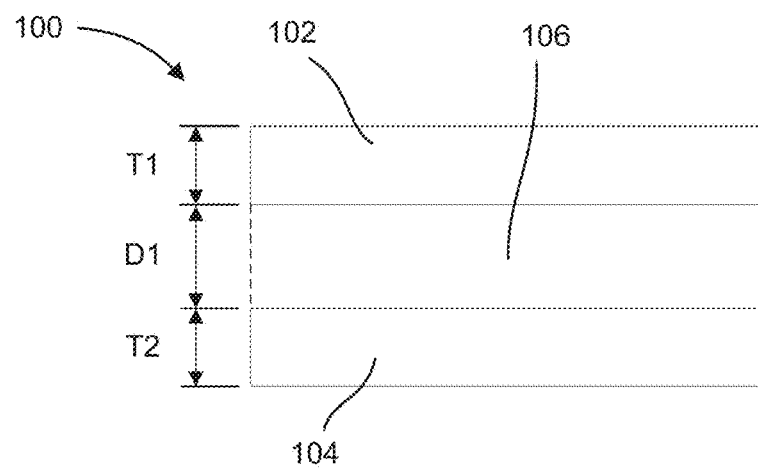
FIG. 1C illustrates a front view of the microwave resonator of FIG. 1A.

For example, the spatial interaction region 106, as illustrated in FIGS. 1A-1C, can be a substantially cylindrical volume between the disk-shaped resonator members 102 and 104. The volume of the spatial interaction region 106 can be calculated by determining a volume of a cylinder having a radius (e.g., R1 and R2) and a height (e.g., D1). The volume V of the spatial interaction region 106 can be expressed as:

$$V = \pi r^2 h$$

where "r" is the radius (e.g., R1, R2) of the spatial interaction region 106 and h is the height (e.g., D1) of the spatial interaction region 106.

Figure 2A:
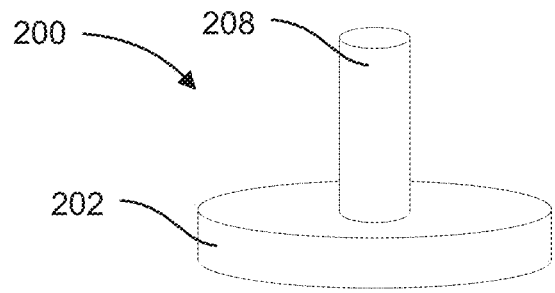
FIG. 2A illustrates a front elevation view of a microwave resonator in accordance with an example of the present disclosure.

With reference to FIG. 2A, a microwave resonator 200 in accordance with an example of the present disclosure is illustrated. The microwave resonator 200 shown can be a resonator configured to confine waves (e.g., an electromagnetic field) in the microwave range of the electromagnetic spectrum. The microwave resonator 200 can be a single member resonator including a resonator member 202. The resonator members 202, as illustrated, can be disk shaped. However, the shape of the resonator member is not intended to be limited in any way by this disclosure. The resonator members can have a disk shape, a ring shape, or any other shape.

In the case of microwave resonator 200, in which no region is defined between multiple resonator members, the spatial interaction region can be the resonator member 202 itself. The resonator member 202 can be configured to confine an electromagnetic field in and around the resonator member 202 that is provided to the microwave resonator 200 by a microwave emitter or by an outside environment. The electromagnetic field can be a field in a microwave region of the electromagnetic spectrum. The electromagnetic field confined in and around the resonator member 202 of the microwave resonator 200 can comprise microwaves having a wavelength and frequency substantially the same as a resonant frequency/wavelength of the microwave resonator 200, to which the resonator is tuned.

As further illustrated in FIG. 2A, a mount 208 can be coupled to the resonator member 202. The mount 208 can be made of a same or different materials then the resonator member 202. The mount 208 can be mounted to the resonator member 202 using any known method for coupling a mount to a resonator member, such as adhesive, welding, mechanical coupling, or any other known method that does not adversely affect the function of the resonator to an undesirable amount. The method of mounting the mount to the resonator member 202 is not intended to be limited by this disclosure in any way.

Figure 2B:
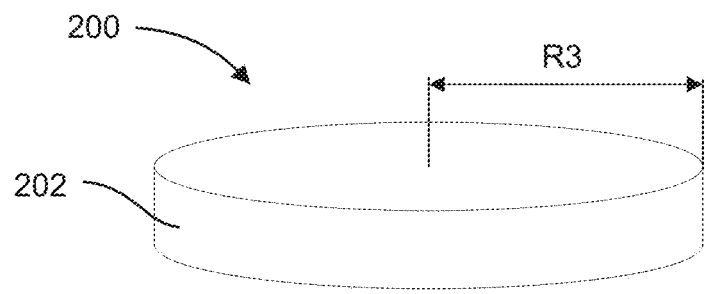
FIG. 2B illustrates a close up front elevation view of the microwave resonator of FIG. 2A.
Figure 2C:
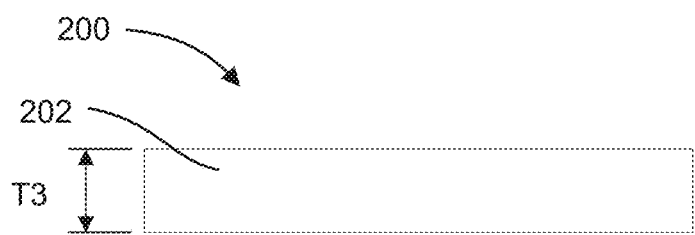
FIG. 2C illustrates a front view of the microwave resonator of FIG. 2A.

The mount 208 can facilitate mounting the microwave resonator 200 to an enclosure. Specifically, the mount 208 can facilitate mounting the resonator member 202 to an inner surface of an enclosure. The mount 208 can be sized to ensure that the resonator member 202 is disposed at a desired position within the enclosure. As shown in FIG. 2B, the resonator member 202 can be a disk having a size at least partially defined by a radius R3. As shown in FIG. 2C, the resonator member 202 can be a disk having a thickness T3.

A region in and around the resonator member 202 can define a spatial interaction region configured to confine the electromagnetic field in the microwave range of the electromagnetic spectrum. The spatial offset region can be defined at least partially by the resonator member 202 of the microwave resonator 202. Accordingly, the spatial offset region can be at least partially a substantially cylindrical volume defined by the resonator member 202. The volume of resonator member 202 can be calculated by determining a volume of a cylinder having a radius R3 and a height T3. For example, the volume V of the spatial offset region can be expressed as:

$$V = \pi r^2 h$$

where "r" is the radius (e.g., R3) of the resonator member 202 and h is the height (e.g., T3) of the resonator member 202.

Figure 3:
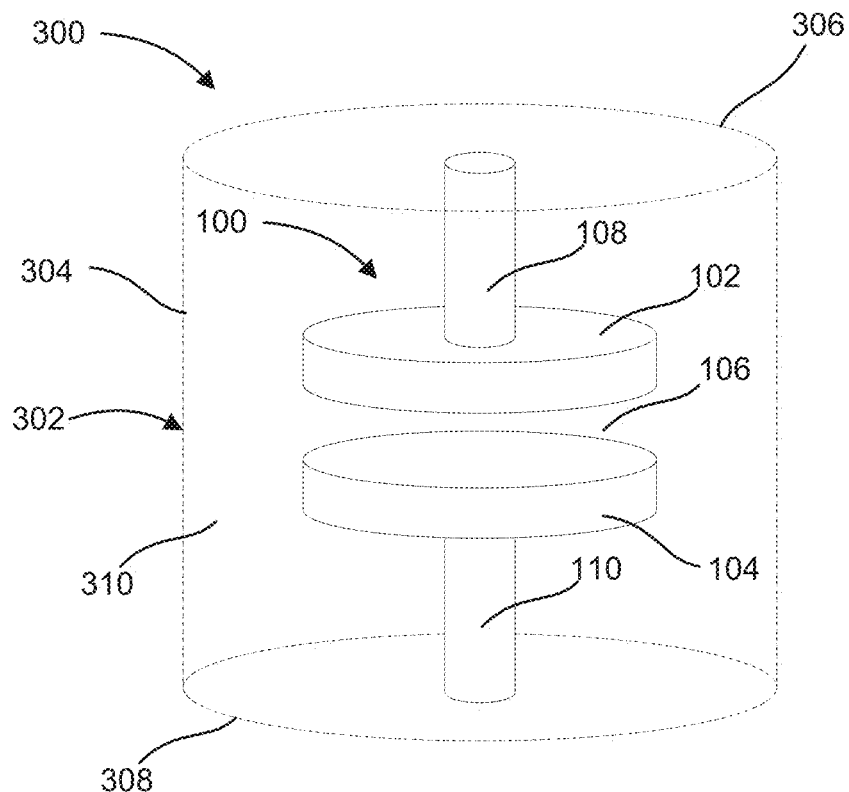
FIG. 3 illustrates the microwave resonator of FIG. 1A inside an enclosure in accordance with an example of the present disclosure.

As shown in FIG. 3, the microwave resonator 100 can be contained in an enclosure 302 to form a microwave resonator system 300. The enclosure 302 can include an outer wall 304, an upper wall 306, and a lower wall 308 that together define an inner cavity 310 configured to receive the microwave resonator 100. The mount 108 coupled to the first resonator member 102 can be coupled to the upper wall 306. The mount 110 coupled to the second resonator member 104 can be coupled to the lower wall 308. The first resonator member 102 and the second resonator member 104 can be mounted respectively to the upper wall 306 and the lower wall 308 of the enclosure 302 with mounts 108 and 110 appropriately sized to dispose the resonator members within the inner cavity 310 to maintain the size of the spatial interaction region 106 between the first and second resonator members.

The enclosure can be configured to contain a vacuum between the first resonator member and the second resonator member, a gas material of lower dielectric constant than a dielectric constant in the first resonator member and the second resonator member, a solid material of lower dielectric constant than a dielectric constant in the first resonator member and the second resonator member, or a liquid material of lower dielectric constant than a dielectric constant in the first resonator member and the second resonator member.

Figure 4:
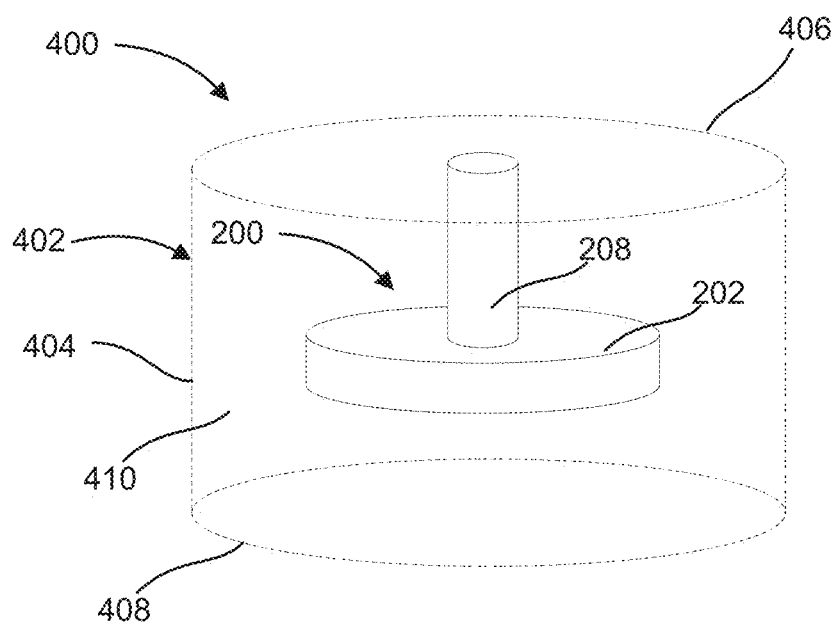
FIG. 4 illustrates the microwave resonator of FIG. 2A inside an enclosure in accordance with an example of the present disclosure.

As shown in FIG. 4, the microwave resonator 200 can be contained in an enclosure 402 to form a microwave resonator system 400. The enclosure 402 can include an outer wall 404 as well as an upper wall 406 and a lower wall 408 joined by the outer wall 404. The walls 404, 406, and 408 can together define an inner cavity 410 configured to receive the microwave resonator 200. The mount 208 coupled to the resonator member 202 can be coupled to the upper wall 406 or the lower wall 408. The resonator member 202 can be mounted to the upper wall 406 or the lower wall 408 of the enclosure 402 with mount 208 appropriately sized to dispose the resonator member 202 within the inner cavity 410.

The enclosure can be configured to contain a vacuum, a gas material of lower dielectric constant than a dielectric constant in the resonator member, a solid material of lower dielectric constant than a dielectric constant in the resonator member, or a liquid material of lower dielectric constant than a dielectric constant in the resonator member.

The enclosures 302 and 402 can shield the microwave resonators 100 and 200 from outside microwaves, electromagnetic radiation, disturbances, perturbations, and/or environmental conditions and factors that may disturb the devices in order to ensure proper functioning of the microwave resonators 100 and 200. The enclosures can be made of a metal such as aluminum or copper, or a non-metal, or any material known for holding a microwave resonator. The material of the enclosure is not intended to be limited by this disclosure in any way. Additionally, the shape of the enclosure is not intended to be limited in any way. The enclosure may be cylindrical as shown or can be spherical, square, pyramidal, conical, or of any other shape having any number of sides and defining an inner cavity for storing a microwave resonator.

Figure 5A:
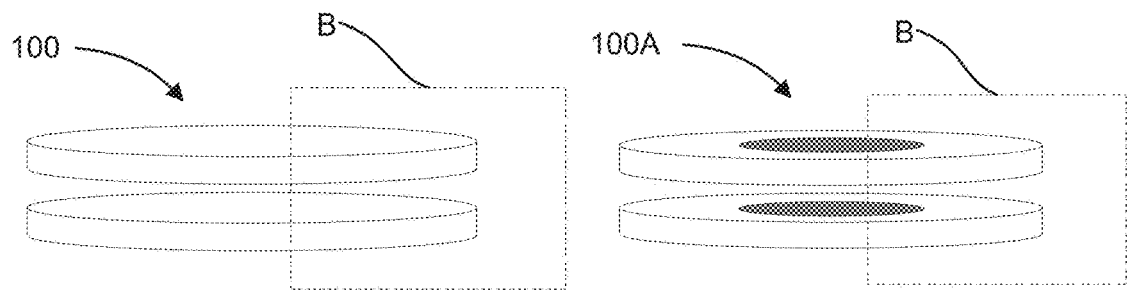
FIG. 5A illustrates a front elevation view of the microwave resonator of FIG. 1A.
Figure 5B:
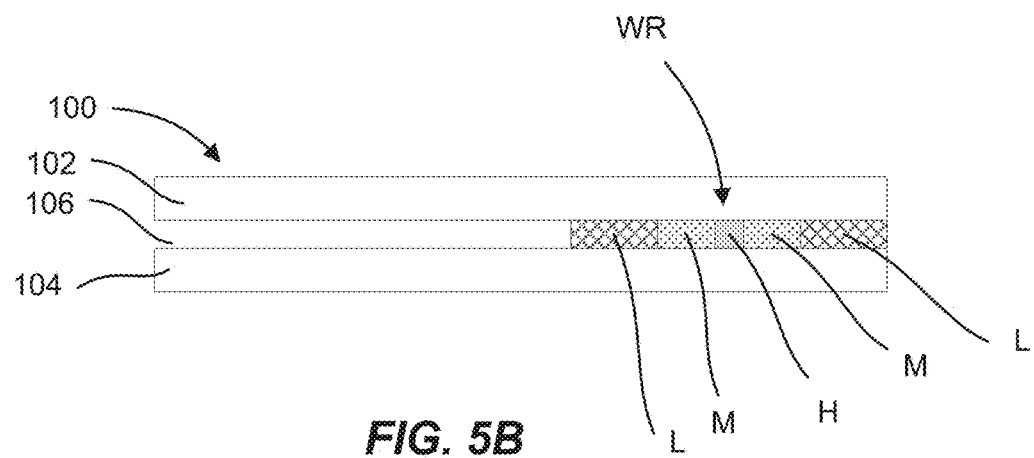
FIG. 5B front view of wave propagation in a region of the microwave resonator of FIG. 1A, where the region is identified in FIG. 5A.
Figure 5C:
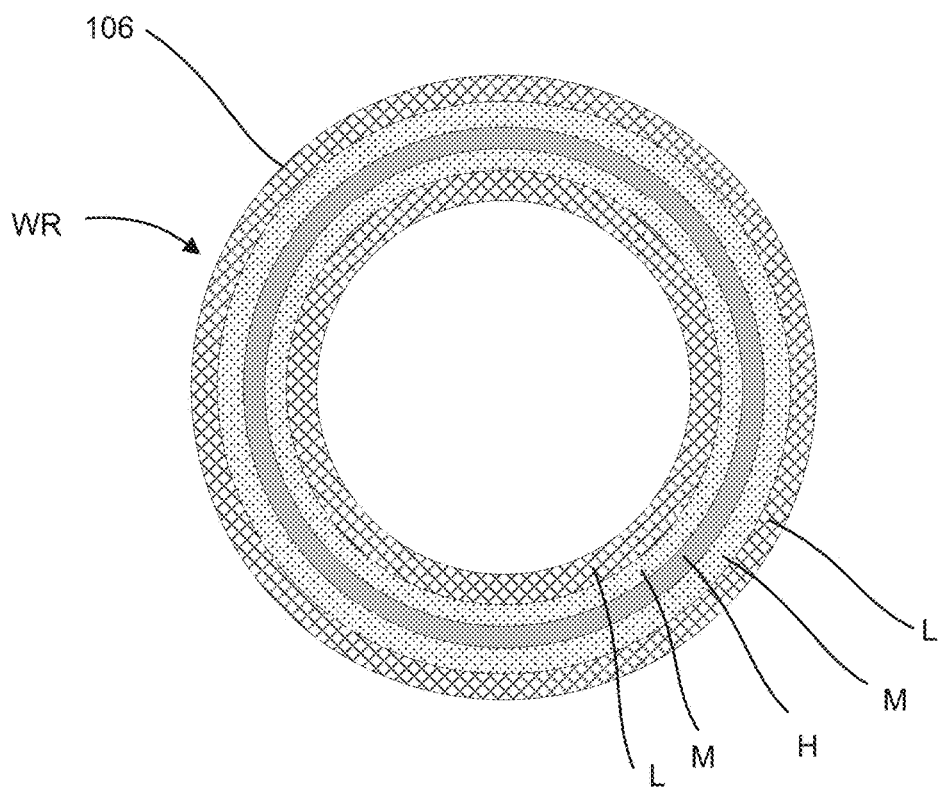
FIG. 5C illustrates microwave propagation in the microwave resonator of FIG. 2A.

FIGS. 5A, 5B, and 5C illustrate intensity profiles of microwave propagation within dual disk microwave resonators such as the microwave resonator 100. FIG. 5A illustrates possible configurations of a microwave resonator. For example, the microwave resonator can be the microwave resonator 100 of FIG. 1A in which the resonator members are each disk shaped. Furthermore, the microwave resonator can have an alternative configuration where the resonator members are ring-shaped members, such as microwave resonator 100A. The shape of the microwave resonators and/or associated spatial interaction region are not intended to be particularly limited by this disclosure; any shape that is workable for confining microwaves of electromagnetic radiation can be used for the resonator members or spatial interaction region. In the illustrated configurations, the microwave resonators 100 and 100A can be configured as whispering gallery mode resonators that propagate whispering gallery waves or modes. Whispering gallery waves/modes are a type of wave that can travel around near an outside perimeter of a circular member or a concave surface.

FIG. 5B illustrates a cross-sectional view of the microwave resonator 100 zoomed in at about region B illustrated in FIG. 5A. Although microwave resonator 100 is illustrated, it will be appreciated that the field intensity profile of microwaves would be similar in the microwave resonator 100A. In FIG. 5B, a microwave field intensity profile is illustrated in a wave region WR located at an outer region of the microwave resonator 100. In the spatial interaction region, the intensity profile can have a high area H in which the intensity of the electromagnetic microwave field is at a peak intensity. Outside the high H, the intensity of the microwave field can decrease to a medium region M and a low region L. Although the regions of microwave intensity in the wave region WR are illustrated as discrete areas, it will be appreciated that the intensity of the microwave field can gradually vary throughout the wave region WR. The intensities of the microwave field will likely not be at discrete levels in discrete blocks but will instead vary in intensity as a spectrum throughout the spatial interaction region 106 at a theoretically infinite number of intensities.

FIG. 5C shows a top view illustration of intensities of waves propagating in the spatial interaction region 106. As illustrated the can be confined in the spatial interaction region 106 to propagate around an outer region of the spatial interaction region 106 substantially near a circumference of the spatial interaction region 106. FIG. 5B and FIG. 5C illustrate intensities of an electromagnetic field with a vertical polarization in the spatial interaction region 106. In other words, the electromagnetic field in the spatial interaction region is oriented predominantly in a plane arranged in a same direction as the thickness of the resonator members defining the spatial interaction region 106. Polarization of an electromagnetic field in microwave resonators can also be in transverse polarization in which the electromagnetic field is oriented predominantly in a plane of the disk, which is normal to the thickness of the disk.

Figure 6A:
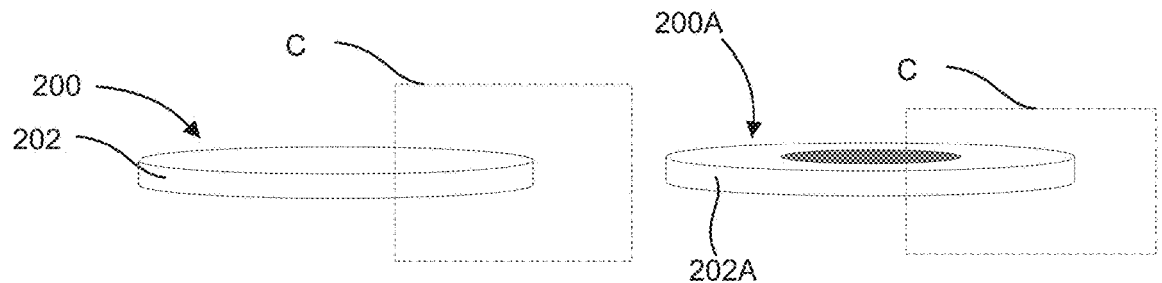
FIG. 6A illustrates a front elevation view of the microwave resonator of FIG. 2A.
Figure 6B:
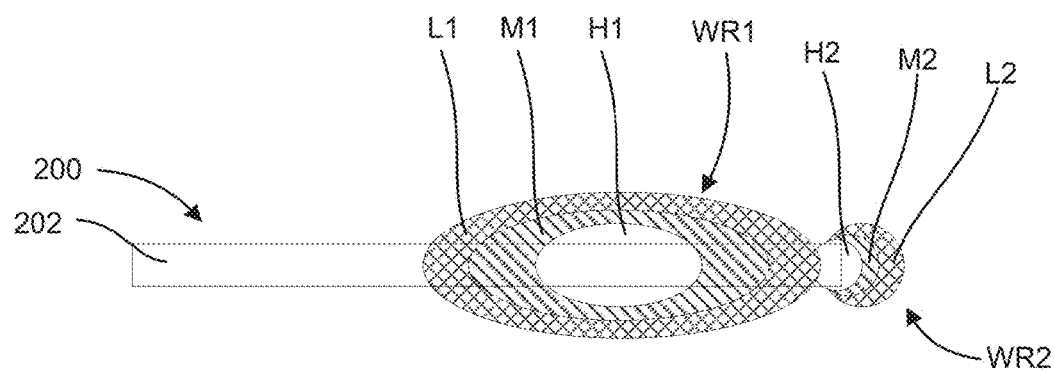
FIG. 6B illustrates a front view of wave propagation in a region of the microwave resonator of FIG. 2A, where the region is identified in FIG. 6A.

FIGS. 6A and 6B illustrate intensity profiles of microwave propagation within a single disk microwave resonators such as the microwave resonator 200. FIG. 6A illustrates possible configurations of a microwave resonator. For example, the microwave resonator can be the microwave resonator 200 of FIG. 2A in which the resonator members are each disk shaped. Furthermore, the microwave resonator can have an alternative configuration where the resonator members (e.g., see resonator member 202A) are ring-shaped members, such as microwave resonator 200A. The shape of the microwave resonators is not intended to be particularly limited by this disclosure; any shape that is workable for confining microwaves of electromagnetic radiation can be used for the resonator members. In the illustrated configurations, the microwave resonators 200 and 200A can be configured as whispering gallery mode resonators that propagate whispering gallery waves or modes.

FIG. 6B illustrates a cross-sectional view of the microwave resonator 200 zoomed in at about region C illustrated in FIG. 6A. Although microwave resonator 200 is illustrated, it will be appreciated that the field intensity profile of microwaves would be similar in the microwave resonator 200A. In FIG. 6B, a microwave field intensity profile is illustrated in a wave region WR1 located at an outer region of the microwave resonator 200. In the spatial interaction region (e.g., the resonator member and area around the resonator member), the intensity profile can have a high area H1 in which the intensity of the electromagnetic microwave field is at a peak intensity. Outside the high H1, the intensity of the microwave field can decrease to a medium region M1 and a low region L1.

FIG. 6B illustrates a case where polarization of an electromagnetic field in the microwave resonator can be in transverse polarization in which the electromagnetic field is oriented predominantly in a plane of the disk, which is normal to the thickness of the disk. In this case, an additional wave region WR2 can be found at a circumferential edge of the resonator member. In the spatial interaction region (e.g., the resonator member and area around the resonator member) including wave region WR2, the intensity profile can have a high area H2 in which the intensity of the electromagnetic microwave field is at a peak intensity. Outside the high H2, the intensity of the microwave field can decrease to a medium region M2 and a low region L2.

Although the regions of microwave intensity in the wave regions WR1 and WR2 are illustrated as discrete areas, it will be appreciated that the intensity of the microwave field can gradually vary throughout the wave regions WR1 and WR2. The intensities of the microwave field will likely not be at discrete levels in discrete blocks but will instead vary in intensity as a spectrum throughout the spatial interaction region and/or around the resonator member 202 at a theoretically infinite number of intensities.

Similar to as illustrated in FIG. 5C, the microwaves can be confined to propagate around an outer region of the resonator member 202 substantially near a circumference of the resonator member 202. FIG. 6B illustrate intensities of an electromagnetic field with a transverse polarization in and around the resonator member 202. In other words, the electromagnetic field in the spatial interaction region is oriented predominantly in a plane resonator member 202. Polarization of an electromagnetic field in microwave resonators can also be in vertical polarization in which the electromagnetic field is oriented predominantly in a plane normal to a longitudinal surface of the resonator member 202.

Structures and wave propagation in exemplary microwave resonators have been described above and illustrated in the figures. With respect to the microwave resonators described herein, certain features and elements of the microwave resonators act to facilitate generation of a resonant field enhancement within the spatial interaction region and/or the resonator members. Resonant field enhancement as described herein, and as facilitated by the design of the microwave resonators, means that field intensities of electromagnetic radiation and microwaves in the resonators can be several orders of magnitude higher than would be expected in devices of similar size and power consumption. The resonant field enhancement in the microwave resonators described herein can allow measurement precision that is substantially higher than would be expected without the resonant enhancement of the microwave field.

Various elements of the microwave resonators can be varied, changed or modified in order to obtain a desirable resonance enhancement factor for the microwave resonator. The resonance enhancement factor or "REF" can be defined as a characteristic of a microwave resonator that results in a multiplier of a microwave field intensity over that of a microwave field intensity of a microwave field in the absence of the microwave resonator. For example, in a case of a microwave field in the absence of a microwave resonator, in which the microwave field intensity (of an arbitrary unit (a.u.)) of the microwave field of a certain frequency is 5, the same microwave field associated with a microwave resonator as taught herein having a microwave field intensity of 10 would result in a REF of the microwave resonator being 2. The microwave resonators described herein have dimensions, spacings, and materials for resonator members that achieve a REF of substantially around $10^3$ or greater. Accordingly, the microwave resonator according to the principles described herein are compact dielectric whispering gallery mode (WGM) microwave resonators with inherent high resonance enhancement factor of $10^3$ or greater and with small microwave effective mode volume which is a volume (e.g. spatial interaction region 106 or resonator members) where the microwave mode energy is constrained within the resonator.

The resonator members of the microwave resonators described herein can be made of a dielectric material. The dielectric material can have a high dielectric constant (e.g. greater than 20, greater than 60) and low microwave loss tangent (e.g. $<10^{-4}$, $<10^{-3}$, $<10^{-2}$), although the range of the dielectric constant and microwave loss tangent are not intended to be particularly limited by this disclosure in any way. Exemplary dielectric materials for the resonator members can include Rutile ($TiO_2$) and/or Strontium Titanate ($SrTiO_3$), Lithium Niobate, Lithium Tantalate, Sapphire, Diamond, Silicon, Silicon Carbide (SiC), Yttrium Aluminum Garnet (YAG), $KTaO_3$, or any dielectric material with dielectric constant sufficient to produce a desired resonance enhancement factor in the microwave resonator. In general, any dielectric materials can be used in the resonators, particularly dielectric materials with environmental stability, relatively low microwave loss, and/or relatively high dielectric constants. High dielectric constants in dielectric materials used in the resonator members lead to small devices and manufacturing repeatability.

Furthermore, isomorphic versions of dielectric materials can be used as well doped variants of the dielectric materials. For example, Sapphire is a commonly used dielectric material. Additionally, sapphire can be doped with another material in order to alter certain physical parameters and characteristics of the sapphire. For example, Yttrium Aluminum Garnet (commonly referred to as YAG), is essentially Sapphire with the Yttrium atom replacing some of the Aluminum atoms in the sapphire. This allows the dielectric material to be co-doped with other trace elements to tune electrical and optical properties.

Optical absorption or conductivity of sapphire, for example, can be altered by doping and can then be exploited to tune the microwave resonator to a desired resonant frequency. Isomorphic dielectric materials and doped variants can be used to obtain different resonance enhancement factors for the microwave resonators described herein.

Dielectric materials that have a dielectric constant larger than ~40 for microwave frequencies around 10 GHz are desirable for use in the resonator members of the microwave resonators described herein. When the microwave frequency goes higher to 100 GHz the dielectric constant can be a smaller number such as 20-30 and up to any higher number.

In microwave resonator 100 of FIGS. 1A-1C, for example, two high-dielectric constant resonator members 102 and 104 in the form of disks with spatial interaction region 106 between them facilitates a large resonant field enhancement occurs in the spatial interaction region 106 due to the presence of the two resonator members (disks). The gap D1 between the two resonator members 102 and 104 can be adjusted to certain distances to achieve a high REF of $10^3$ or greater (or even $10^2$ or greater). For example, with reference to FIGS. 1A-1C, and FIGS. 7A and 7B FIG. 7A illustrates a graph showing the effect of setting a vertical distance in mm between resonator members 102 and 104 to achieve a high field intensity in arbitrary units (a.u), and therefore, a high REF. As shown, a large spike in microwave field intensity results in a range of vertical distances between the resonator members. Distances that are too large or too small can cause a large drop off in field intensity. Accordingly, the distance between resonator members can be adjusted to improve field intensity and obtain a needed or desired REF factor of a microwave resonator.

Additionally, radius size of R1 and R2 of the resonator members can be modified to achieve a high field intensity and to modify the REF of the microwave resonator. With reference to FIGS. 1A-1C and FIG. 7B, the field intensity in the microwave resonator can increase significantly based on radius size or radial distance in mm of the resonator members 102 and 104. Accordingly, the REF can be optimized or increased based on radial size of the resonator members 102 and 104 of the microwave resonator. It will be appreciated that the radius of the resonator members and the distance between the resonator members define a volume of the spatial interaction region where the microwaves are confined. In other words, the volume of the spatial interaction region can affect the REF of a microwave resonator.

The geometrical dimension of the resonators and resonator members described herein can be within 0.1 CC to 0.5 CC volume. The microwave mode volume (e.g., the volume of the spatial interaction region 106 or resonator member 202 where microwave fields are confined) can be (for example) as small as $0.001\lambda 1^3$, where $\lambda 1$ is the microwave wavelength associated with the resonant frequency or resonant frequencies of the microwave resonator.

With the architecture described in the dual disk configuration, the thickness of the spatial interaction region 106 can be very compact compared to current microwave resonators. The thickness D1 of the spatial interaction region 106 can be 100 times smaller than the wavelength $\lambda 1$, or even smaller. The dual disk architecture enables a strong intensity localization in the spatial interaction region near the perimeter of the resonator members 102 and 104. The large refractive index of the dielectrics used for the resonator members 102 and 104 can cause the resonator members 102 and 104 to act as two hard walls to confine the microwave mode for the vertical polarization between the two resonator members 102 and 104.

Figure 7A:
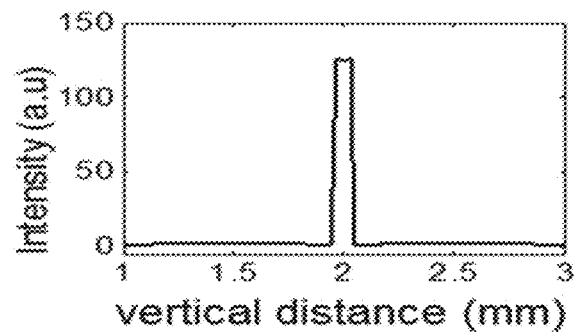
FIG. 7A illustrates a graph showing intensity within a mode volume of an exemplary microwave resonator in accordance with an example of the present disclosure.
Figure 7B:
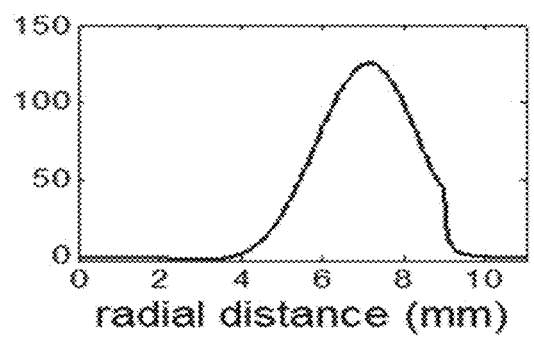
FIG. 7B illustrates a graph showing intensity within a mode volume of an exemplary microwave resonator in accordance with an example of the present disclosure.

As shown in FIGS. 7A and 7B, well-contained high intensity microwave fields in the spatial interaction region 106 can create microwave field intensities in the microwave resonator 100 that can be several orders of magnitude higher than would be expected in devices of similar size, dimension, and power consumption. The larger than expected field intensities are a result of the high resonance enhancement factor found in the devices as described herein that cause a regular microwave field to be intensified by a multiple of $10^3$. The intensified microwave field in the resonator can allow for measurement precision that is substantially higher than would be expected without the resonance enhancement of the microwave field by the microwave resonator described herein. Additionally, presence of appropriate microwave components in close proximity to the disk assembly allows tuning of the assembly's resonance frequency.

In microwave resonator 200 of FIGS. 2A-2C, a high-dielectric constant single disk is used as the resonator member 202. The resonator member 202 can have a thickness T3 that is smaller than λ2, which is the microwave wavelength associated with the resonant frequency or resonant frequencies of the microwave resonator 200. In microwave resonator 200, the microwave energy can be delocalized into the air as well as being contained within the resonator member 202. The thickness T3 can be 100 times smaller or smaller than the wavelength λ2 of the resonant frequency of the resonator. In the structure of the microwave resonator 200 shown in FIG. 2A, the resonator can be a WGM resonator where a substantial portion of the microwave energy is in the air. The small thickness T3 of the disk helps delocalize the mode energy from the dielectric material to the air. With reference to FIGS. 2A-2C and FIG. 6B, the mode maximum, or maximum field intensity, is close to the perimeter of the disk and a substantial amount of energy is contained in the environment surrounding the resonator member 202. The presence of the field in the air allows the field to interact with microwave active components external to the resonator member 202 and placed in moderate to high intensity microwave field locations. Additionally, presence of appropriate microwave components in close proximity to the disk allows tuning of the assembly's resonance frequency. The geometrical dimension of these resonators can be within 0.1-0.5 CC volume, and the microwave mode volume (e.g. resonator member 202) can be (for example) as small as $0.001\lambda2^3$, where λ2 is the microwave wavelength of the resonator.

For both the microwave resonator 100 and the microwave resonator 200, the high resonance enhancement factors and the small volumes can give the microwave resonators very high quality factors and very high quality Q to volume V ratios. The high Q/V ratio is a figure of merit for many applications where microwave resonators are used such as Magnetometry and Electrometry and other sensing and measurement applications.

In both the microwave resonator 100 and the microwave resonator 200, most or all of the microwave mode energy can be confined to the air or environment adjacent to the resonator members 102, 104, or 202 rather than in the dielectric host material of the resonator members 102, 104, or 202. With most of the field energy confined to the air or surrounding environment, interaction of the microwave energy with any external components placed at the proximity of the resonators 100 and 200 can be strong. For the two disc configuration (e.g. resonator 100), this allows placement of RF interacting materials and components, such as photonic resonators, photonic frequency converters, quantum-capable materials (such as vacancy-doped diamond and silicon-carbide), and/or other microwave-active technology in the high-field intensity air-gap region (e.g. spatial interaction region 106) to enhance the microwave-material and component interactions. In the one-disc configuration (e.g. resonator 200), this allows placement of microwave active components in close proximity to the disk (e.g., resonator member 202) to enable enhanced interactions between the microwave field confined by the resonator and RF interacting materials and components such as photonic resonators, photonic frequency converters, quantum-capable materials (such as vacancy-doped diamond and silicon-carbide), and/or other microwave-active technology.

Figure 8:
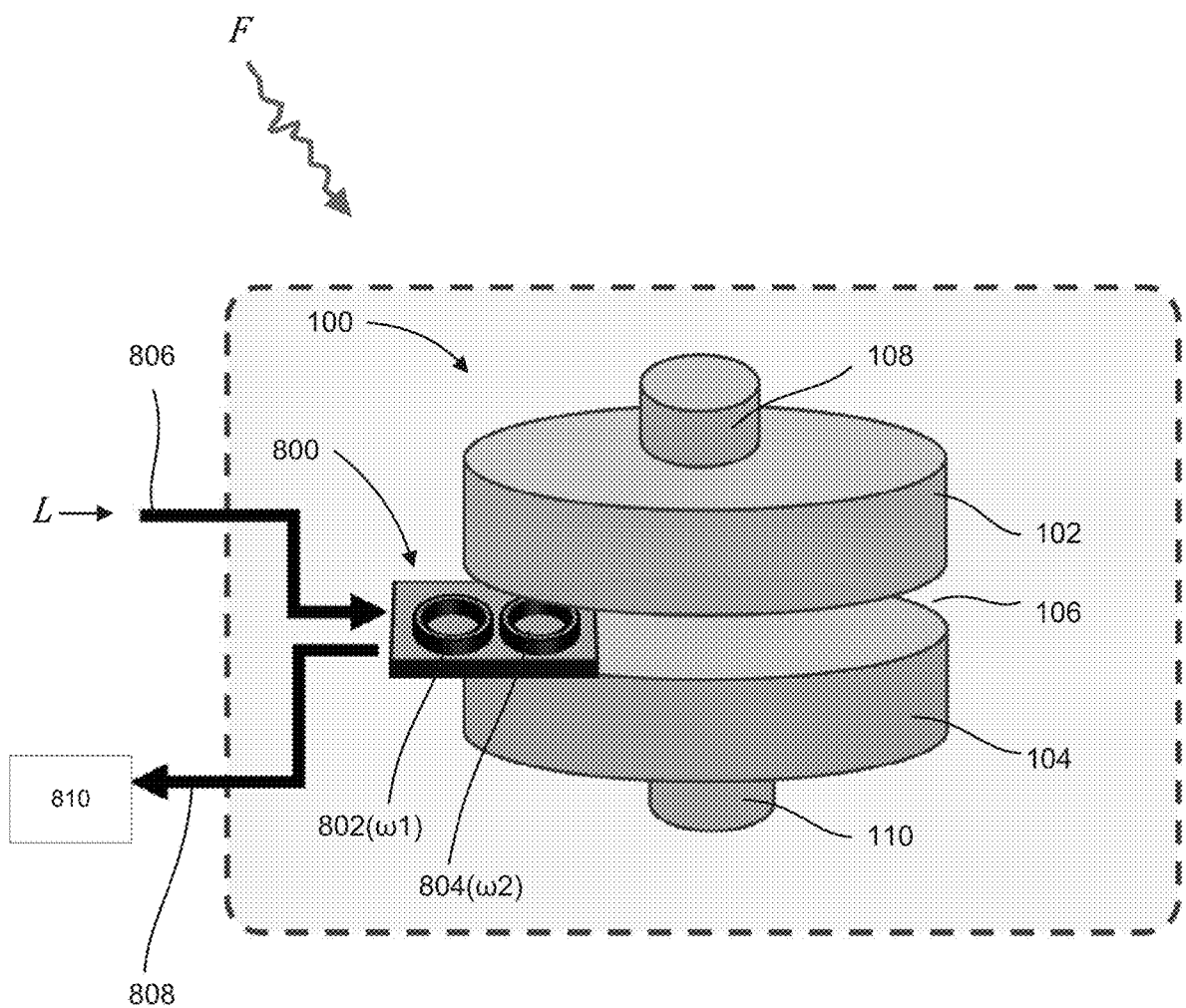
FIG. 8 illustrates a microwave resonator in accordance with an example of the present disclosure being used in a sensing application.

With the resonator configurations discussed herein, RF and microwave field sensing can be accomplished using either of microwave resonators 100 or 200 in conjunction with one or more electro, magnetic, or microwave sensitive components. For example, FIG. 8 illustrates a configuration of microwave resonator 100 and components used therein to measure the intensity of a microwave field within the spatial interaction region 106. As shown a microwave sensitive component 800 can be inserted into spatial interaction region 106 to sense/measure characteristics of a microwave field in the spatial interaction region 106. The microwave sensitive component 800 can be a photonic coupled resonator that supports two resonances based on elements 802 and 804. Each of elements 802 and 804 can have a resonance, respectively represented as resonance $\omega_1$ and resonance $\omega_2$. The spacing between the resonances $\omega_1$ and $\omega_2$ can be equal to an RF frequency. The microwave sensitive component 800 can be inserted into the spatial interaction region 106 of the microwave resonator 100 as shown in FIG. 8.

RF field sensing using the microwave sensitive component 800 can occur as follows with reference to FIG. 8. An RF signal F with a given amplitude and frequency, which matches the resonant frequency of the microwave resonator 100, reaches the spatial interaction region 106 of the microwave resonator 100. It will be understood that the resonant frequency of the resonator can be altered or tuned to a certain frequency by inserting a dielectric element or dielectric body within the spatial interaction region 106 in a controlled manner to be disposed in a specific position associated with a desired resonant frequency of the resonator.

Due to the nature, architecture, and construction of the microwave resonator 100, the intensity of the RF signal F is enhanced at the resonant frequency of the resonator. The microwave sensitive component 800 can sense and provide a signal containing characteristics of the RF signal F and additional microwave fields within the spatial interaction region 106. The signal can be sent to a computer containing a processor and/or program that reads out the signal and creates data representing the characteristics of the signal from the microwave sensitive component 800 to sense and measure fields in the resonator 100.

Additionally, information associated with the RF signal F can be brought into the optical domain for sensing and measuring. For example, in a case the microwave sensitive component 800 can be an electro-optic coupled photonic resonator inserted into the spatial interaction region 106 to do RF field sensing. The microwave sensitive component 800 can be connected to a cable 806 and 808, being an optical fiber. The intensity of the RF signal F can match a frequency of the microwave resonator 100 and can be enhanced by the microwave resonator 100. The RF signal F intensity can interact with the microwave sensitive component 800 and mix with the optical signal of the microwave sensitive component 800. For mixing the RF signal F with an optical signal, a laser light L with an amplitude A and frequency $\omega_1$ matching one of the resonant frequencies of the microwave sensitive component 800. The laser light L enters the photonic resonator (e.g. which is a type of the microwave sensitive component 800) at location 806 and is enhanced due to the optical resonance between the frequency $\omega_1$ of the laser light L and the frequency $\omega_1$ of the photonic resonator. The laser light L interacts with the RF signal and is mixed due to the nonlinear mixing property of the photonic material which is called an electro-optic property. The mixing of the laser light with the microwave field will generate a frequency $\omega_2=\omega_1+\Omega$ (where $\Omega$ is the frequency of the RF signal F). Additionally, $\omega_2$ is also the second resonance is an RF resonance of the coupled photonic resonator. This second resonance enhances the generated signal at the frequency of $\omega_2$. In this mixing approach, $\omega_2$ is a sideband to $\omega_1$ with the information of the RF signal F ($\Omega$).

The amplitude of the information at the frequency $\omega_2$ is proportional to $\kappa \times L \times F$, where $\kappa$ coefficient has the enhancement factor due to the optical resonance and the RF resonance, as well as the nonlinear mixing factor which is also called the electro-optic coefficient. Using the differences between the frequencies of the laser light L and the RF signal F and the resonant frequencies $\omega_1$, $\omega_2$ of the photonic resonator, intensities and other characteristics of ambient RF fields (RF signal F) and other microwave fields within the microwave resonator 100 can be determined. Additionally, using the fiber optic, laser light L, and a photo-optic reader component 810, the RF signals within resonator 100 can be transduced to the optical domain and interpreted and read in the optical domain by reader 810 (see path 808). A similar configuration can be used on microwave fields near the resonator member 202 of the microwave resonator 200 to determine characteristics of fields in a single disk resonator.

When the resonator 100 or 200 is confined within an enclosure, the resonator can be shielded by outside magnetic, electromagnetic, RF, or electric fields. Because no perturbations or disturbances affect the resonator when inside the enclosure, a resonator inside an enclosure can provide a highly accurate measuring device for determining intensity of microwave fields or other characteristics inside of the resonator.

Another effect that can be utilized in microwave resonators according to the principles described herein is that magnetic fields and electric fields can be used together or separate to enhance the microwave field in the microwave resonator. For example, a material such as a quantum capable material like silicon carbide or vacancy doped diamond can be used in the microwave resonators and disposed in the spatial interaction region 106. The vacancy doped diamond can be formed in a thin film and placed in the spatial interaction region 106. The vacancy doped diamond film can at least partially fill, or completely fill the volume of the spatial interaction region 106.

Figure 9A:
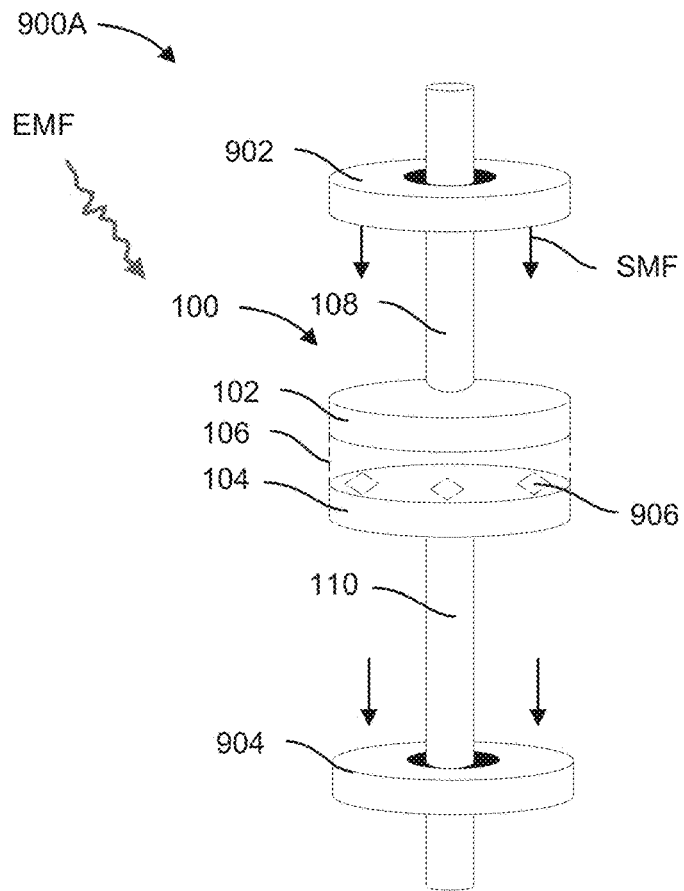
FIG. 9A illustrates a front elevation view of a microwave resonator system in accordance with an example of the present disclosure.
Figure 9B:
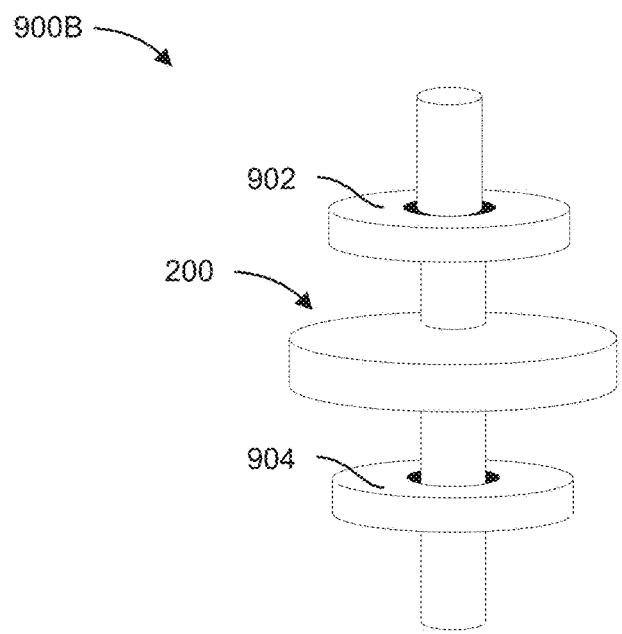
FIG. 9B illustrates a front elevation view of a microwave resonator system in accordance with an example of the present disclosure.

The vacancy doped diamond with nitrogen vacancy (NV) centers have microwave transition frequencies that are sensitive to an applied magnetic field. Accordingly, with vacancy doped diamond disposed in the spatial interaction region 106 of the microwave resonator, a magnetic field can be applied to the microwave resonator. As shown in FIG. 9A, one or more magnets 902 and/or 904 can be placed in proximity to the microwave resonator 100 to apply a magnetic field in a microwave resonator system 900A. It will be appreciated that one or more magnets can similarly be applied to induce a magnetic field on any microwave resonator according to the principles described herein, such as microwave resonator 200, in a microwave resonator system 900B as shown in FIG. 9B.

As shown in FIG. 9A, the microwave frequency of the vacancy doped diamond with NV center can be tuned based on the position and strength of the magnets 902 and/or 904. If the microwave resonator 100 has a resonant frequency equal to the microwave frequency of the vacancy doped diamond 906, the microwave signal in the microwave resonator 100 is enhanced.

The magnets 902 and/or 904 can act as static magnetic field SMF on the microwave resonator 100. In addition to the static magnetic field SMF provided by magnets 902 and/or 904, any external magnetic fields EMF acting on the microwave resonator 100 can change the microwave frequency of the vacancy doped diamond 906 to deviate from the expected frequency due to the static magnetic field SMF applied by the magnets 902 and/or 904. Sensing, measuring, and or calculating of the deviation of the microwave frequency of the vacancy doped diamond 906 can provide data needed to allow for sensing and/or calculating of the external magnetic field EMF. To excite the microwave frequency of the vacancy doped diamond 906, a laser light such as a 532 nm laser or red laser may be needed to excite the NV center of the vacancy doped diamond 906.

In an alternative configuration, two or more electrical conductors can replace, or be used in addition to the magnets 902 and 904 to induce an electrical field on the microwave resonator 100 that augments the microwave field in the resonator. In similar fashion to the magnetic embodiment of FIG. 9A, the known electrical field applied between two electrodes to the resonator can be used to measure and quantify an external electrical field.

When the resonator 100 or 200 is confined within an enclosure, the resonator can be shielded by outside magnetic, electromagnetic, RF, or electric fields. Because no perturbations or disturbances affect the resonator when inside the enclosure, a resonator inside an enclosure can provide a highly accurate measuring device for determining intensity of microwave fields or other characteristics inside of the resonator.

Figure 9C:
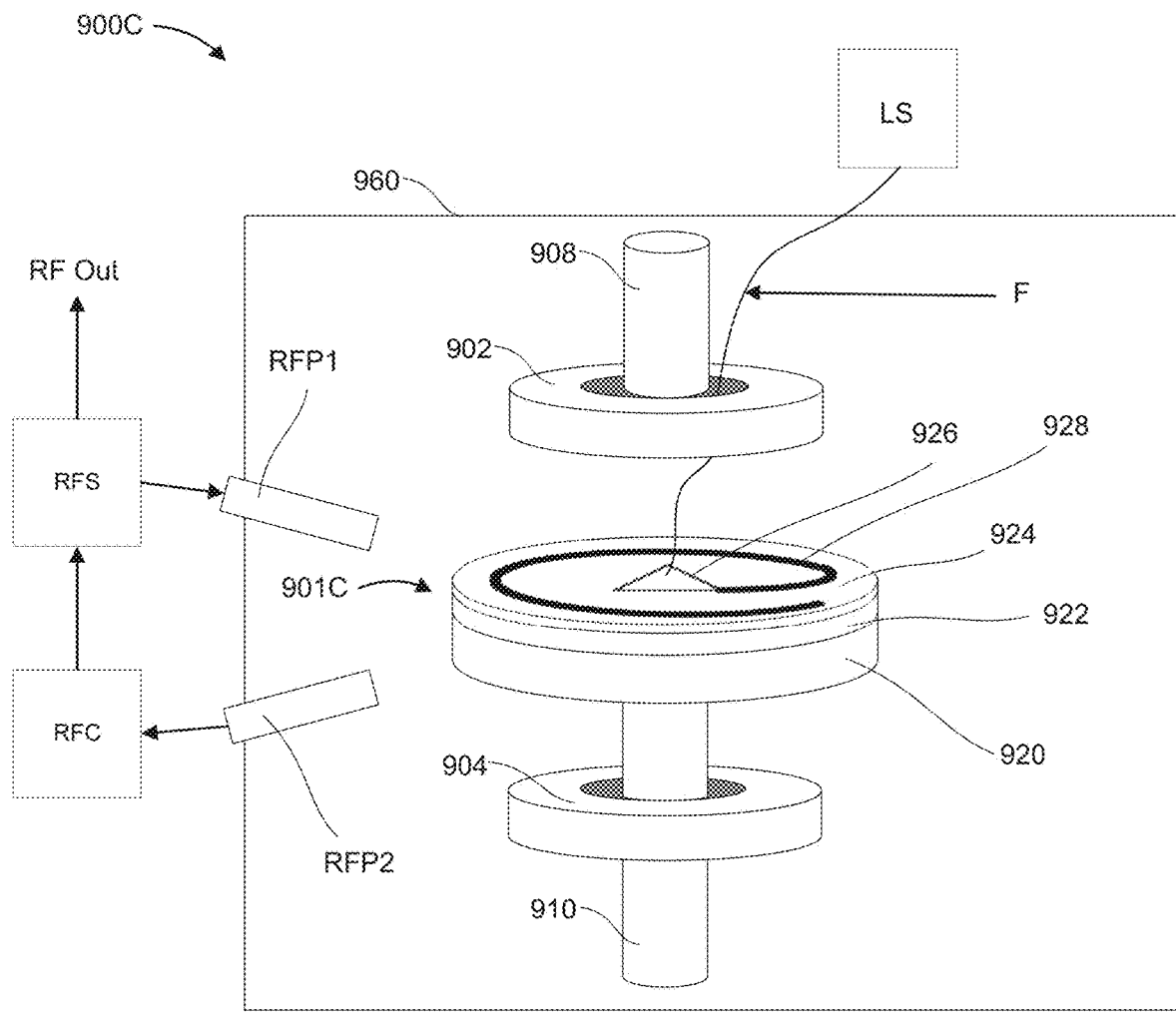
FIG. 9C illustrates a front elevation view of a microwave resonator system in accordance with an example of the present disclosure.
Figure 9D:
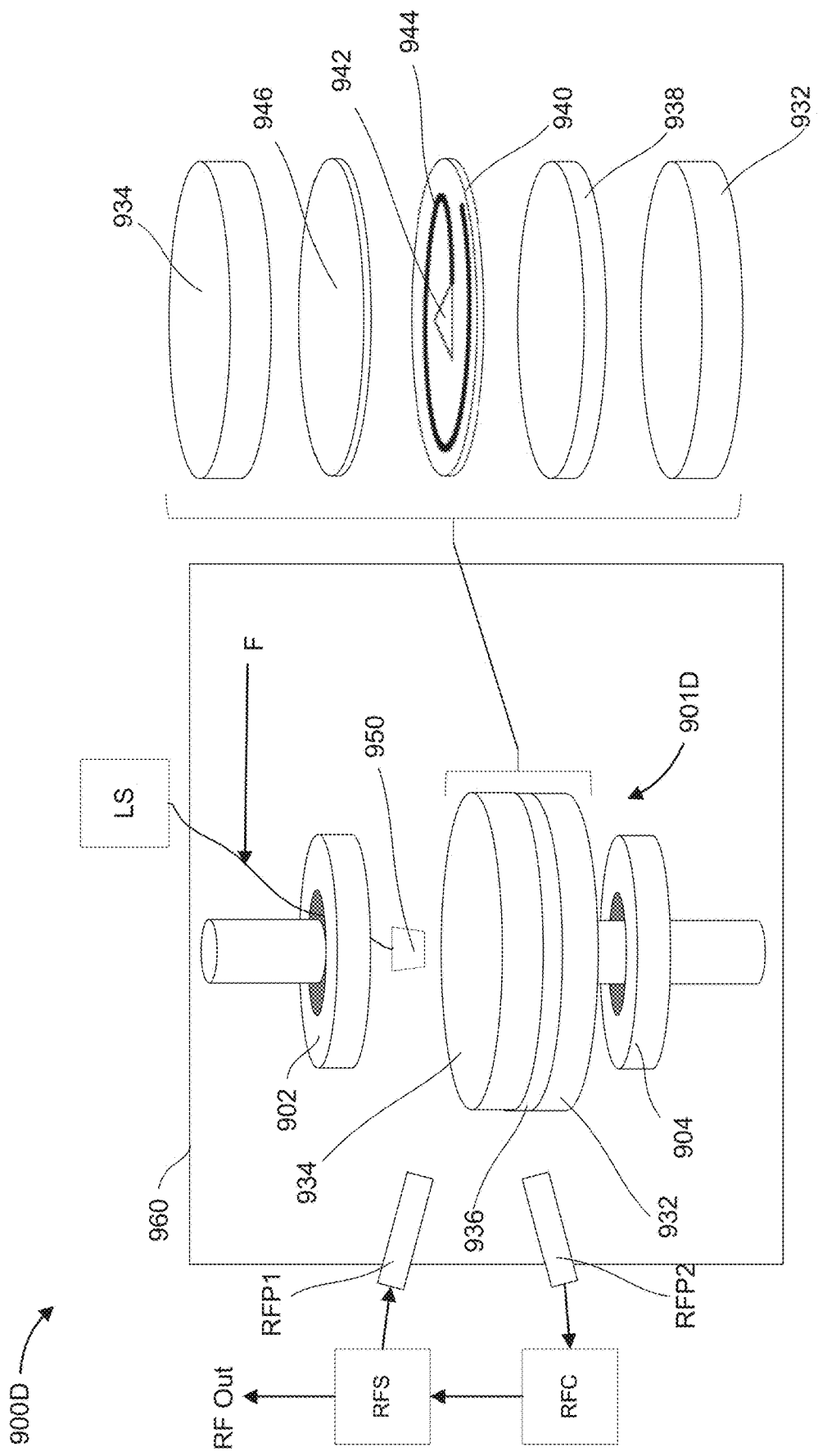
FIG. 9D illustrates a front elevation view of a microwave resonator system in accordance with an example of the present disclosure.

Additional configurations will be discussed for microwave resonator systems 900C and 900D as shown in FIGS. 9C and 9D. As illustrated in FIG. 9C, a single disk microwave resonator 901C can be mounted between two magnets 902 and 904 to apply a magnetic field to the resonator 901C inside an enclosure 960. In this configuration, light from a laser light source LS outside of enclosure 960 can be applied to the microwave resonator 901C to mix optical light with the RF signal resonating in the resonator for purposes described above with respect to the discussion of FIG. 8. Light from the laser light source LS can be delivered via an optical fiber F to the resonator 901C. The resonator can comprise a resonator member 920. The resonator member 920 can comprise a layer of a first material 922, (e.g. vacancy doped diamond). The resonator member can further comprise a layer of a second material 924 (e.g. SiO2 of a thickness of hundreds nanometers to 1 micron) disposed on the first material 922. A spiral waveguide 928 (made of SiN for example, or any material suitable for a waveguide in a microwave resonator) can be patterned on the second material 924 that starts at a center of the second material 924 and spirals outward to the perimeter of the resonator 901C. The waveguide 928 can be cladded in a layer of SiO2. However, the disclosure does not intend to limit the shape or material of the waveguide 928 to those shapes and materials recited.

At the entrance the waveguide 928 a grating coupler 926 can be formed of the waveguide material and may taper in shape to capture the laser light and direct it into the waveguide 928. By this configuration, the grating coupler 926 can facilitate guiding of light from the laser light source LS and the fiber F to enter the waveguide 928. In the spiral configuration shown, light in the waveguide 926 spirals closer to a perimeter of the resonator member 920 where the microwave field of the microwave resonator 901C is at a higher intensity. The laser light from the from the waveguide 928 can leak to the first material 922 layer and generate a microwave signal which is in resonance with the resonant frequency of the microwave resonator 901C. The mixed signals can be used, as described in reference to FIG. 8, to measure and/or isolate different signals in the resonator 901C An RF control circuit can supply and/or receive the RF signals to/from the microwave resonator 901C. A pair of RF probes RFP1 and RFP2 can be in wave communication with the resonator 901C to receive or transmit RF signals. The probes RFP1 and RFP2 can be in wave, radio, or electrical communication with an RF source RFS that can supply an RF signal and an RF control RFC that can alter an RF signal (e.g. a phase shifter, amplifier, filter, etc.). An RF signal can be output from the RF source based on the output of the resonator and the RF control for analysis or measurement.

Similarly, a dual disk resonator can work in a similar configuration to system 900C. FIG. 9D illustrates a dual disk resonator system 900D including a dual disk resonator 901D. As illustrated in FIG. 9D, a dual disk microwave resonator 901D can be mounted between two magnets 902 and 904 to apply a magnetic field to the resonator 901D inside an enclosure 960. In this configuration, light from a laser light source LS outside of enclosure 960 can be applied to the microwave resonator 901D to mix optical light with the RF signal resonating in the resonator for purposes described above with respect to the discussion of FIG. 8. Light from the laser light source LS can be delivered via an optical fiber F to the resonator 901D. The resonator can comprise a first resonator member 932 and a second resonator member 934. The first and second resonator members 932 and 934 can comprise dielectric materials as described elsewhere in this disclosure similar to the resonator members of resonator 100. The spatial interaction region 936 of the resonator 901D can include a layer of a first material 938, (e.g. vacancy doped diamond). The resonator member can further comprise a layer of a second material 940 (e.g. $SiO_2$ of a thickness of hundreds nanometers to 1 micron) disposed on the first material 938. A spiral waveguide 944 (made of SiN for example, or any material suitable for a waveguide in a microwave resonator) can be patterned on the second material 940 that starts at a center of the second material 940 and spirals outward to the perimeter of the resonator 901D. The waveguide 944 can be cladded in a layer of $SiO_2$. However, the disclosure does not intend to limit the shape or material of the waveguide 944 to those shapes and materials recited.

At the entrance the waveguide 944 a grating coupler 942 can be formed of the waveguide material and may taper in shape to capture the laser light and direct it into the waveguide 944. An additional layer or third material 946 can cover the waveguide 944 and the grating coupler 942 in the spatial interaction region 936.

In this configuration, the waveguide 944 and the grating coupler 942 can be embedded in the spatial interaction region 936 of the resonator 901D. To guide light to the grating coupler 942, a microlens 950 can be disposed on the end of the optical fiber F to collimate light into the grating coupler 942 from the fiber F. The grating coupler 942 can facilitate guiding of light from the microlens 950 to enter the waveguide 944. In the spiral configuration shown, light in the waveguide 944 spirals closer to a perimeter of the spatial interaction region 936 where the microwave field of the microwave resonator 901D is at a higher intensity. From there, the laser light from the from the waveguide 944 can leak to the first material 938 layer and generate a microwave signal which is in resonance with the resonant frequency of the microwave resonator 901D. The mixed signals can be used, as described in reference to FIG. 8, to measure and/or isolate different signals in the resonator 901D Similar to system 900C, an RF control circuit can supply and/or receive the RF signals to/from the microwave resonator 901D of system 900D. A pair of RF probes RFP1 and RFP2 can be in wave communication with the resonator 901D to receive or transmit RF signals. The probes RFP1 and RFP2 can be in wave, radio, or electrical communication with an RF source RFS that can supply an RF signal and an RF control RFC that can alter an RF signal (e.g. a phase shifter, amplifier, filter, etc.). An RF signal can be output from the RF source based on the output of the resonator and the RF control for analysis or measurement.

Additionally, although not shown, in both systems 900C and 900D, a temperature controller can be included to stabilize the temperature of the system 900D and 900C, in and/or out of the enclosures 960 in order to ensure a desirable operating temperature for detecting, analyzing, and/or measuring signals from the resonators 901C and 901D.

Further disclosed herein is a method 1000 of facilitating formation of a microwave resonator device. The method 1000 is illustrated in FIG. 10. The method 1000 can include step 1002 of configuring a first resonator member to be comprised of a dielectric material. The method 1000 can further include step 1004 of configuring a second resonator member comprised of a dielectric material to be spatially offset from the first resonator member to define a spatial interaction region between the first resonator member and the second resonator member configured to confine an electromagnetic field in a microwave region of the electromagnetic spectrum. The method can further comprise a step 1006 of configuring the microwave resonator to comprise a resonance enhancement factor of 10^3 or greater. The resonance enhancement factor determining the resonant field enhancement can be based on one or more of: a volume of the spatial interaction region; a height of the spatial interaction region; a lateral dimension of the spatial interaction region; thicknesses of the resonator members; and/or a dielectric constant of the dielectric material used for the resonator members.

In the method 1000, the spatial offset between the first resonator member and the second resonator member defining the spatial interaction region can be less than a microwave wavelength associated with a resonant frequency of the microwave resonator device. Additionally, the microwave resonator device can facilitate generation of a resonant field enhancement within the spatial interaction region.

The method can further comprise configuring an enclosure to comprise a wall that defines an inner cavity within the enclosure. The method can further comprise mounting first resonator member and the second resonator member to the wall of the enclosure within the inner cavity to be disposed spaced apart from each other to define the spatial interaction region between the first and second resonator members. The method can further comprise configuring the spatial interaction region to comprise one or more of: a vacuum between the first resonator member and the second resonator member, a gas material of lower dielectric constant than is used in the first resonator member and the second resonator member, a solid material of lower dielectric constant than is used in the first resonator member and the second resonator member, and/or a liquid material of lower dielectric constant than is used in the first resonator member and the second resonator member.

Further disclosed herein is a method 1100 of facilitating formation of a microwave resonator device. The method 1100 can include a step 1102 of configuring a resonator member that is configured to confine an electromagnetic field in a microwave region of the electromagnetic spectrum to comprise a thickness measured in a direction parallel to a longitudinal axis of the resonator member. The method can further comprise a step 1104 of configuring the thickness of the resonator member to be smaller than a microwave wavelength associated with a resonant frequency of the microwave resonator device. The microwave resonator device can facilitate generation of a resonant field enhancement within and in proximity to the resonator member. The method can further comprise a step 1106 of configuring the microwave resonator to comprise a resonance enhancement factor of $10^3$ or greater. The resonance enhancement factor determining the resonant field enhancement can be based on one or more of: a volume of the resonator member; a lateral dimension of the resonator member; a thickness of the resonator member; and/or a dielectric constant of the dielectric material used for the resonator member. The method 1100 can further comprise configuring an enclosure to comprise a wall that defines an inner cavity within the enclosure. The method 1100 can further comprise mounting the resonator member to the wall of the enclosure within the inner cavity.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A microwave resonator device comprising:
a first resonator member comprised of a dielectric material; and
a second resonator member comprised of a dielectric material, the second resonator member being positioned spatially offset from the first resonator member to define a spatial interaction region between a lower surface of the first resonator member and an upper surface of the second resonator member configured to confine an electromagnetic field in a microwave region of the electromagnetic spectrum;
wherein the spatial offset between the first resonator member and the second resonator member defining the spatial interaction region is less than a microwave wavelength associated with a resonant frequency of the microwave resonator device, and
wherein the microwave resonator device facilitates generation of a resonant field enhancement within the spatial interaction region.

2. The microwave resonator device of claim 1, wherein the microwave first and second resonator device comprises a resonance enhancement factor of $10^3$ or greater, the resonance enhancement factor determining the resonant field enhancement and being based on one or more of:
a volume of the spatial interaction region;
a height of the spatial interaction region;
a lateral dimension of the spatial interaction region;
thicknesses of the resonator members; or
a dielectric constant of the dielectric material of at least one of the first or second resonator members.

3. The microwave resonator device of claim 1, wherein the spatial offset between the first and second resonator members is between 75 and 200 times smaller than the microwave wavelength.

4. The microwave resonator device of claim 1, wherein at least one of the first resonator member or the second resonator member is composed of a dielectric material having a dielectric constant over 40.

5. The microwave resonator device of claim 1, wherein at least one of the first resonator member or the second resonator member is composed of a dielectric material having a low microwave loss between $10^3$ and $10^5$.

6. The microwave resonator device of claim 1, wherein the volume of the spatial interaction region is between $0.0001\lambda^3$ and $0.01\lambda^3$ herein $\lambda$ is the microwave wavelength associated with the resonant frequency of the microwave resonator device.

7. The microwave resonator device of claim 1, wherein the dielectric material of at least one of the first or second resonant members comprises rutile or strontium titanate.

8. The microwave resonator device of claim 1, wherein the first resonator member and the second resonator member comprise at least one of disks and rings.

9. The microwave resonator device of claim 1, wherein the first resonator member and the second resonator member are arranged parallel to one another, and are axially aligned.

10. The microwave resonator device of claim 1, further comprising:
an enclosure that defines an inner cavity within the enclosure,
wherein the first resonator member and the second resonator member are mounted to the enclosure within the inner cavity to maintain the spatial interaction region between the first and second resonator members.

11. The microwave resonator device of claim 10, wherein the enclosure is configured to facilitate formation of a vacuum between the first resonator member and the second resonator member.

12. The microwave resonator device of claim 10, wherein the enclosure is configured to receive at least one of a gas, solid, or a liquid material of a lower dielectric constant than a dielectric constant of at least one of the first resonator member or the second resonator member.

13. The microwave resonator device of claim 1, wherein the microwave resonator device comprises a type of microwave resonator device in the form of a whispering gallery mode resonator device confining the electromagnetic field for vertical polarization.

14. The microwave resonator device of claim 1, wherein vacancy doped diamond are disposed in the spatial interaction region.

15. A microwave resonator system comprising:
the microwave resonator device of claim 1;
one or more microwave sensitive components disposed in the spatial interaction region,
wherein the one or more microwave sensitive components comprise at least one of:
  a detector configured to measure a frequency and strength of the electromagnetic field;
  a photonic coupled resonator;
  an electro-optical coupled photonic resonator;
  a quantum capable material comprising at least one of silicon carbide or vacancy doped diamond; or
  a dielectric element operable to tune the resonant frequency of the microwave resonator.

16. The microwave resonator system of claim 15, further comprising:
a microwave emitter configured to supply the electromagnetic field in the form of microwave electromagnetic waves to the spatial interaction region.

17. The microwave resonator system of claim 15, further comprising:
one or more magnets operable to create an augmented magnetic field in the microwave resonator device; and
one or more magnetic sensitive components placed in the spatial interaction region.

18. The microwave resonator system of claim 15, further comprising:
two or more conductors or semiconductors operable to create an augmented electric field in the microwave resonator device; and
one or more electric field components placed in the spatial interaction region.

19. The microwave resonator system of claim 15, further comprising:
one or more magnets operable to create an augmenting magnetic field in the microwave resonator device;
two or more conductors or semiconductors operable to create an augmenting electric field in the microwave resonator device; and
one or more electric, magnetic, and microwave field sensitive components placed in the interaction region.

20. A microwave resonator device comprising:
a resonator member comprised of a dielectric material and configured to confine an electromagnetic field in a microwave region of the electromagnetic spectrum;
wherein the thickness of the resonator member is at least one hundred times smaller than a microwave wavelength associated with a resonant frequency of the microwave resonator device, and
wherein the microwave resonator device facilitates generation of a resonant field enhancement within and in proximity to the resonator member.

21. The microwave resonator device of claim 20, wherein the microwave resonator comprises a resonance enhancement factor of $10^3$ or greater, the resonance enhancement factor determining the resonant field enhancement and being based on one or more of:
a volume of the resonator member;
a thickness of the resonator member;
a lateral dimension of the resonator member; or
a dielectric constant of the dielectric material used for the resonator member.

22. The microwave resonator device of claim 21, wherein the thickness of the resonator member is between 75 and 200 times smaller than the microwave wavelength associated with the resonant frequency.

23. The microwave resonator device of claim 21, wherein the first resonator member and the second resonator member are composed of dielectric materials having a dielectric constant over 40.

24. The microwave resonator device of claim 21, wherein the first resonator member and the second resonator member are composed of dielectric materials having a low microwave loss between $10^3$ and $10^5$.

25. The microwave resonator device of claim 21, wherein the volume of the resonator member is between $0.0001\lambda^3$ and $0.01\lambda^3$, wherein $\lambda$ is the microwave wavelength associated with the resonant frequency of the microwave resonator device.

26. The microwave resonator device of claim 20, wherein the microwave resonator device comprises a type of microwave resonator device in the form of a whispering gallery mode resonator device having transverse polarization.

27. The microwave resonator device of claim 20, wherein the dielectric material is rutile or strontium titanate.

28. The microwave resonator device of claim 20, further comprising:
an enclosure that defines an inner cavity within the enclosure,
wherein the first resonator member is mounted to the enclosure within the inner cavity.

29. A method of facilitating formation of a microwave resonator device, the method comprising:
configuring a first resonator member to be comprised of a dielectric material;
configuring a second resonator member comprised of a dielectric material to be spatially offset from the first resonator member to define a spatial interaction region between a lower surface of the first resonator member and an upper surface of the second resonator member configured to confine an electromagnetic field in a microwave region of the electromagnetic spectrum;
wherein the spatial offset between the first resonator member and the second resonator member defining the spatial interaction region is less than a microwave wavelength associated with a resonant frequency of the microwave resonator device, and
wherein the microwave resonator device facilitates generation of a resonant field enhancement within the spatial interaction region.

30. The method of claim 29, further comprising:
configuring the microwave first and second resonator device comprises a resonance enhancement factor of $10^3$ or greater, the resonance enhancement factor determining the resonant field enhancement and being based on one or more of:
a volume of the spatial interaction region;
a height of the spatial interaction region;
a lateral dimension of the spatial interaction region;
thicknesses of the resonator members; or
a dielectric constant of the dielectric material at least one of the first or second resonator members.

31. The method of claim 29, further comprising:
configuring an enclosure to comprise a wall that defines an inner cavity within the enclosure, mounting first resonator member and the second resonator member to the wall of the enclosure within the inner cavity to be disposed spaced apart from each other to define the spatial interaction region between the first and second resonator members.

32. The method of claim 29, further comprising:
configuring the spatial interaction region to comprise one or more of:
   a vacuum between the first resonator member and the second resonator member;
   a gas material of lower dielectric constant than a dielectric constant of at least one of the first resonator member or the second resonator member;
   a solid material of lower dielectric constant than is used in a dielectric constant of at least one of the first resonator member or the second resonator member; and
   a liquid material of lower dielectric constant than a dielectric constant of at least one of the first resonator member or the second resonator member.

33. A method of facilitating formation of a microwave resonator device, the method comprising:
   configuring a resonator member that is configured to confine an electromagnetic field in a microwave region of the electromagnetic spectrum to comprise a thickness measured in a direction parallel to a longitudinal axis of the resonator member;
   configuring the thickness of the resonator member to be at least one hundred times smaller than a microwave wavelength associated with a resonant frequency of the microwave resonator device; and
   wherein the microwave resonator device facilitates generation of a resonant field enhancement within and in proximity to the resonator member.

34. The method of claim 32, further comprising:
   configuring an enclosure to comprise a wall that defines an inner cavity within the enclosure,
   mounting the resonator member to the wall of the enclosure within the inner cavity.

* * * * *